United States Patent
Yamaguchi et al.

(10) Patent No.: US 11,885,015 B2
(45) Date of Patent: *Jan. 30, 2024

(54) DEPOSITION METHOD AND DEPOSITION APPARATUS

(71) Applicant: Tokyo Electron Limited, Tokyo (JP)

(72) Inventors: Katsumasa Yamaguchi, Yamanashi (JP); Tsubasa Yokoi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/804,174

(22) Filed: May 26, 2022

(65) Prior Publication Data

US 2022/0389573 A1    Dec. 8, 2022

(30) Foreign Application Priority Data

Jun. 4, 2021   (JP) .................................. 2021-094462

(51) Int. Cl.
*C23C 16/56* (2006.01)
*C23C 16/40* (2006.01)
*C23C 16/52* (2006.01)

(52) U.S. Cl.
CPC ............ *C23C 16/405* (2013.01); *C23C 16/52* (2013.01); *C23C 16/56* (2013.01)

(58) Field of Classification Search
CPC ........ C23C 16/405; C23C 16/52; C23C 16/56
See application file for complete search history.

(56) References Cited

U.S. PATENT DOCUMENTS 6,103,609 A * 8/2000 Lee ................... H01L 21/28044
257/E21.198

FOREIGN PATENT DOCUMENTS

JP          2003-193233       7/2003
WO   WO-2021042114 A1 *   3/2021   ........... C23C 16/045

* cited by examiner

*Primary Examiner* — Hai Y Zhang
(74) *Attorney, Agent, or Firm* — IPUSA, PLLC

(57) ABSTRACT

A deposition method includes preparing a substrate having an insulating film formed thereon; forming a molybdenum film on the insulating film by supplying a molybdenum-containing gas and a reducing gas to the substrate; and heat-treating the substrate having the molybdenum film formed on the insulating film, without exposing the substrate to atmospheric air.

10 Claims, 5 Drawing Sheets

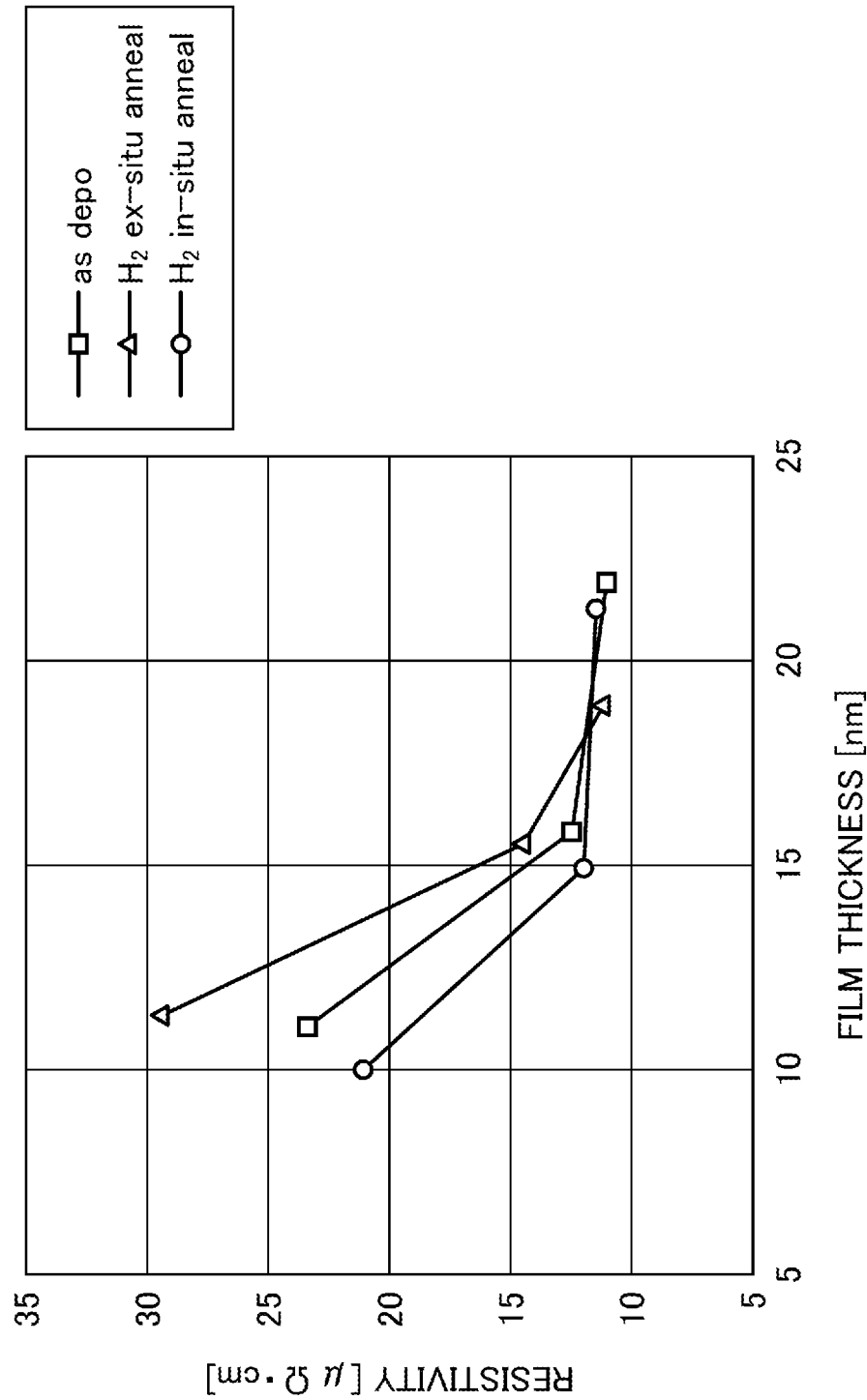

DEPOSITION METHOD AND DEPOSITION APPARATUS

CROSS-REFERENCE TO RELATED APPLICATION

The present application is based on and claims priority to Japanese Priority Application No. 2021-094462 filed on Jun. 4, 2021, the entire contents of which are incorporated herein by reference.

BACKGROUND OF THE INVENTION

1. Field of the Invention

The present disclosure relates to a deposition method and a deposition apparatus.

2. Description of the Related Art

In order to form a wiring pattern on the surface of a semiconductor wafer, or in order to fill recesses such as contact holes or recesses between wiring, a thin film is formed by depositing a metal or a metal compound. For example, Patent Document 1 describes a technique for forming a tungsten film in an embedded hole formed in the surface of a semiconductor wafer by alternately supplying a tungsten-containing gas and a reducing gas to the semiconductor wafer.

RELATED-ART DOCUMENTS

Patent Documents

Patent Document 1: Japanese Laid-open Patent Publication No. 2003-193233

SUMMARY OF THE INVENTION

The present disclosure provides a technique by which a molybdenum film of good quality can be formed.

According to an aspect of the present disclosure, a deposition method includes preparing a substrate having an insulating film formed thereon; forming a molybdenum film on the insulating film by supplying a molybdenum-containing gas and a reducing gas to the substrate; and heat-treating the substrate having the molybdenum film formed on the insulating film, without exposing the substrate to atmospheric air.

BRIEF DESCRIPTION OF THE DRAWINGS

Other objects and further features of the present invention will be apparent from the following detailed description when read in conjunction with the accompanying drawings, in which:

FIG. 5 is a graph illustrating measurement results of the resistivities of molybdenum films.

DETAILED DESCRIPTION OF THE EMBODIMENTS

Figure 1:
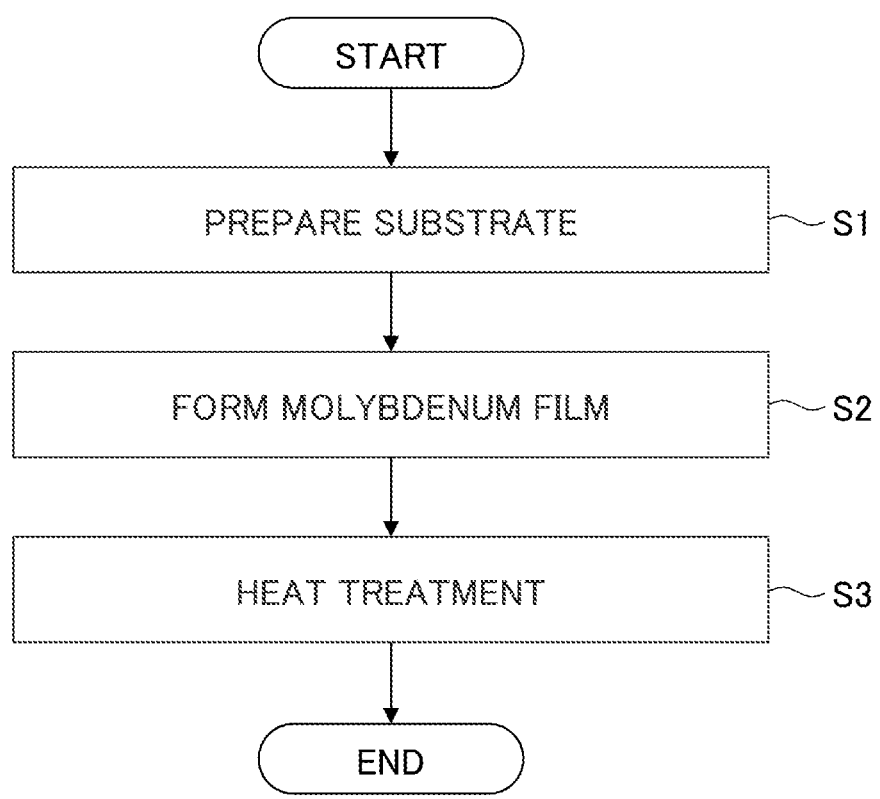
FIG. 1 is a flowchart illustrating an example of a deposition method according to an embodiment.

According to the present disclosure, a molybdenum film of good quality can be formed.

Hereinafter, non-limiting exemplary embodiments of the present disclosure will be described with reference to the accompanying drawings. In all the accompanying drawings, the same or corresponding components are designated by the same or corresponding reference numerals and overlapping descriptions may be omitted.

[Molybdenum (Mo) Film]

A molybdenum film is a low-resistance film and can be formed using fluorine-free gas. Accordingly, it is expected to be applied to gate electrodes, contacts with a source and a drain, word lines of a memory, and the like in MOSFETs.

A molybdenum film is formed by, for example, atomic layer deposition (ALD) or chemical vapor deposition (CVD). When a molybdenum film is formed by ALD or CVD on a base layer such as a blocking oxide film of a NAND memory, a molybdenum-containing gas such as molybdenum dichloride dioxide ($MoO_2Cl_2$) gas and a reducing gas such as hydrogen ($H_2$) gas are supplied to the base layer. At this occasion, in the processing stage of deposition, the surface of the base layer is exposed. Therefore, the surface of the base layer comes into contact with the reducing gas, and oxygen included in the base layer is removed by the reducing gas. As a result, the properties of the base layer may be degraded.

Accordingly, the present disclosure provides a technique that can form a molybdenum film of good quality even when a base layer becomes degraded.

[Deposition Method]

Figure 2A:
FIG. 2A and FIG. 2B are cross-sectional views illustrating an example of steps of the deposition method according to the embodiment.
Figure 2B:
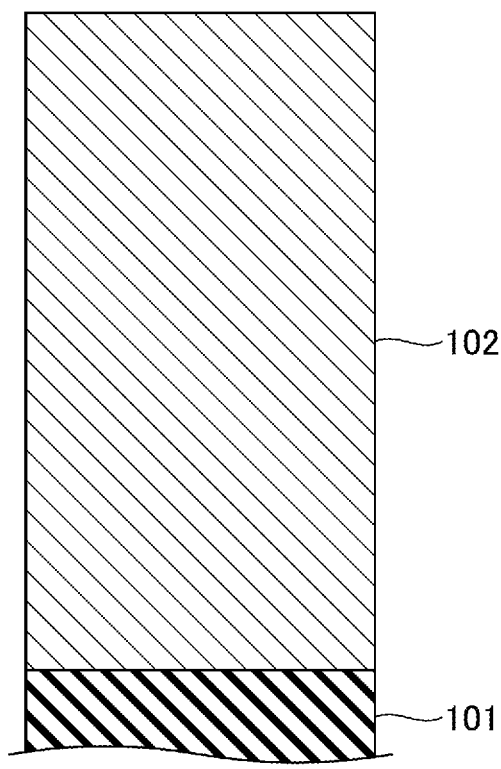

An example of a deposition method according to an embodiment will be described with reference to FIG. 1 through FIG. 2B. FIG. 1 is a flowchart illustrating an example of the deposition method according to the embodiment. FIG. 2A and FIG. 2B are cross-sectional views illustrating an example of steps of the deposition method according to the embodiment.

As illustrated in FIG. 1, the deposition method according to the embodiment includes performing, in this order, step S1 of preparing a substrate, step S2 of forming a molybdenum film, and step S3 of performing heat treatment, such that the molybdenum film is formed on the substrate. The molybdenum film can be used as, for example, word lines of a NAND memory.

As illustrated in FIG. 2A, the step S1 of preparing a substrate includes preparing a substrate 100 having an insulating film 101 formed thereon. The substrate 100 is, for example, a semiconductor wafer such as a silicon wafer. The insulating film 101 may be, for example, a blocking oxide film of a NAND memory, and is formed of, for example, metal oxide such as aluminum oxide (AlO).

As illustrated in FIG. 2B, the step S2 of forming a molybdenum film includes forming a molybdenum film 102 on the insulating film 101. The molybdenum film 102 is formed on the insulating film 101 by supplying a molybdenum-containing gas and a reducing gas to the substrate 100 by, for example, ALD or CVD, with the substrate temperature being adjusted to a predetermined temperature. The molybdenum-containing gas is, for example, $MoO_2Cl_2$ gas. The reducing gas is, for example, $H_2$ gas.

The step S3 of performing heat treatment includes heat-treating the molybdenum film 102 by heating the substrate 100 having the molybdenum film 102 formed on the insulating film 101, without exposing the substrate 100 to atmospheric air. Accordingly, impurity concentrations in the molybdenum film 102 can be reduced, thus improving the quality of the molybdenum film 102. The step S3 of performing heat treatment may include accommodating the substrate 100 in a process chamber, and supplying an inert gas, a reducing gas, or a mixed gas of two or more thereof. Examples of the inert gas include argon gas. Examples of the reducing gas include hydrogen gas. Further, the step S3 of performing heat treatment may include heating the substrate 100 at a constant temperature or heating the substrate 100 while changing the temperature. Further, the substrate temperature at which heat treatment is performed in step S3 may be higher than a substrate temperature at which the molybdenum film 102 is formed in step S2.

As described above, in the deposition method according to the embodiment, after the molybdenum film 102 is formed on the insulating film 101, the molybdenum film 102 is heat-treated by heating the substrate 100 without exposing the substrate 100 to atmospheric air. Accordingly, impurity concentrations in the molybdenum film 102 can be reduced, thus improving the quality of the molybdenum film 102. As a result, when the molybdenum film 102 is used as word lines of a NAND memory, the electrical characteristics of the NAND memory can be improved.

Further, in the deposition method according to the embodiment, the molybdenum film 102 is formed by ALD or CVD using $MoO_2Cl_2$ gas and $H_2$ gas. That is, the molybdenum film 102 is formed by using fluorine-free gas. Therefore, a film (for example, $SiO_2$ film) that is exposed when the molybdenum film 102 is formed is less likely to be damaged by fluorine.

[Deposition Apparatus]

Figure 3:
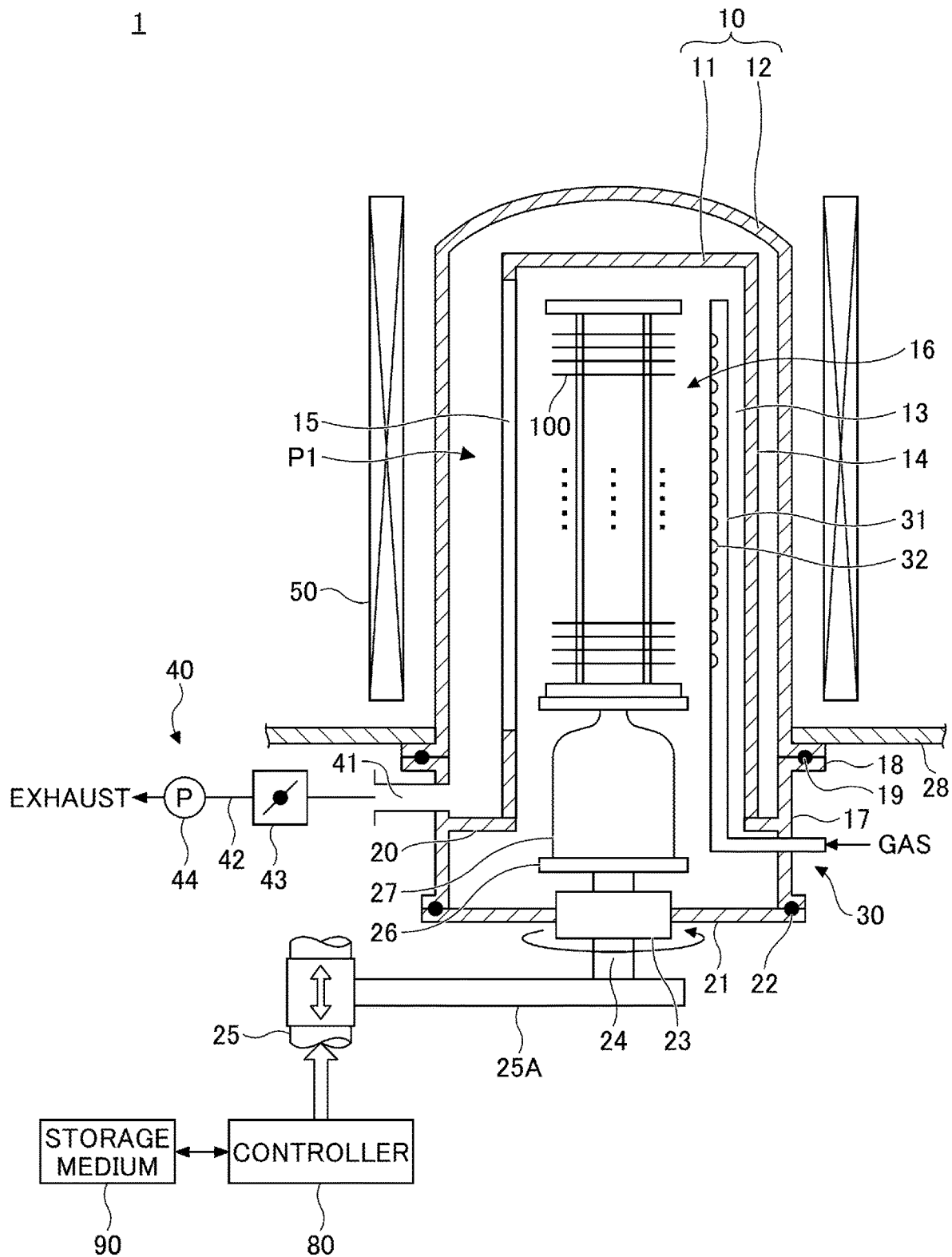
FIG. 3 is a drawing illustrating an example of a deposition apparatus for performing the deposition method according to the embodiment.

An example of a deposition apparatus capable of performing the deposition method according to the embodiment will be described with reference to FIG. 3. As illustrated in FIG. 3, a deposition apparatus 1 is a batch-type apparatus that processes multiple substrates at a time.

The deposition apparatus 1 includes a process chamber 10, a gas supply 30, an exhaust device 40, a heater 50, a controller 80, and the like.

The process chamber 10 is capable of decompressing the interior of the process chamber 10. The process chamber 10 accommodates substrates 100. The substrates 100 are, for example, semiconductor wafers. The process chamber 10 includes an inner tube 11, an outer tube 12, and the like. The inner tube 11 has a cylindrical shape with its top closed and its bottom open. The outer tube 12 has a cylindrical shape with its top closed and its bottom open so as to cover the outer side of the inner tube 11. The inner tube 11 and the outer tube 12 are both formed of a heat-resistant material such as quartz, and are arranged to be concentric to form a double tube structure.

The top of the inner tube 11 is, for example, flat. An accommodating section 13 accommodating a gas nozzle is formed on one side of the inner tube 11 along the longitudinal direction of the inner tube 11 (the up-and-down direction). A portion of the side wall of the inner tube 11 protrudes outward to form a protruding portion 14, and the inside of the protruding portion 14 is formed as the accommodating section 13.

A rectangular opening 15 is formed in the side wall on the other side of the inner tube 11 along the longitudinal direction of the inner tube (the up-and-down direction) so as to face the accommodating section 13.

The opening 15 is a gas exhaust port configured to exhaust the gas that is in the inner tube 11. The length of the opening 15 is the same as the length of a boat 16. Alternatively, the length of the opening 15 is greater than the length of the boat 16 so that the opening 15 extends further in the up-and-down direction than the boat 16.

The lower end of the process chamber 10 is supported by a cylindrical manifold 17 formed of, for example, stainless steel. A flange 18 is formed on the upper end of the manifold 17 and the lower end of the outer tube 12 is disposed on the flange 18 to support the lower end of the process chamber 10. A seal member 19, such as an O-ring, is interposed between the flange 18 and the lower end of the outer tube 12 to cause the inside of the outer tube 12 to be airtight.

An annular support 20 is provided on the inner wall of an upper portion of the manifold 17, and the lower end of the inner tube 11 is disposed on the support 20 to support the lower end of the process chamber 10. An opening is formed in the lower end of the manifold 17, and a lid 21 is airtightly attached to the lower end of the manifold 17 through a seal member 22, such as an O-ring, such that an opening in the lower end of the process chamber 10, that is, the opening in the manifold 17 is sealed. The lid 21 is, for example, formed of stainless steel.

A rotating shaft 24, which rotatably supports the boat 16 is attached to the center of the lid 21 via a ferrofluidic seal 23. The lower end of the rotating shaft 24 is rotatably supported on an arm 25A of a lifting mechanism 25 including a boat elevator.

A rotating plate 26 is provided on the upper end of the rotating shaft 24, and the boat 16 holding the substrates 100 is mounted on the rotating plate 26 through a thermal insulation base 27 formed of quartz. Thus, the lid 21 and the boat 16 move up and down together by actuating the lifting mechanism 25, and the boat 16 is inserted into and removed from the process chamber 10. The boat 16 can be accommodated in the process chamber 10 and substantially horizontally holds the multiple (e.g., 50 to 150) substrates 100 with intervals in the up-and-down direction.

The gas supply 30 includes a gas nozzle 31. The gas nozzle 31 is, for example, formed of quartz. The gas nozzle 31 is provided within the inner tube 11 along its longitudinal direction and is supported such that a lower end portion of the gas nozzle 31 is bent in an L-shape to penetrate the manifold 17. The gas nozzle 31 includes multiple gas holes 32 along its longitudinal direction and discharges various process gases from the multiple gas holes 32 in the horizontal direction. The multiple gas holes 32 are arranged at intervals equal to the intervals of the substrates 100 supported in the boat 16, for example. Examples of the various process gases include gases used in the deposition method according to the embodiment, such as the molybdenum-containing gas, the reducing gas, and the inert gas.

In the example of FIG. 3, a case in which the gas supply 30 includes the one gas nozzle 31 has been described; however, the number of gas nozzles is not limited thereto. For example, the gas supply 30 may include multiple gas nozzles. In this case, the various process gases may be discharged from the same gas nozzle, or may be discharged from different gas nozzles.

The exhaust device 40 exhausts gases discharged from the inside of the inner tube 11 through the opening 15 and discharged from a gas outlet port 41 through a space P1 between the inner tube 11 and the outer tube 12. The gas outlet port 41 is formed in the side wall of an upper portion of the manifold 17 and above the support 20. An exhaust path 42 is connected to the gas outlet port 41. A pressure adjusting valve 43 and a vacuum pump 44 are provided in this order in the exhaust path 42 toward the downstream to evacuate the process chamber 10.

The heater 50 is disposed around the outer tube 12. The heater 50 is provided on, for example, a base plate 28. The heater 50 has a cylindrical shape to cover the outer tube 12. The heater 50 includes, for example, a heating element to heat the substrates 100 in the process chamber 10.

The controller 80 is configured to control the operation of each section of the deposition apparatus 1. The controller 80 may be, for example, a computer. A computer program for operating each section of the deposition apparatus 1 is stored in a storage medium 90. The storage medium 90 may be, for example, a flexible disk, a compact disc, a hard disk, a flash memory, a DVD, or the like.

[Operation of Film Deposition Apparatus]

An example of the operation of the deposition apparatus 1 for performing the deposition method according to the embodiment will be described.

First, the controller 80 controls the lifting mechanism 25 to transfer the boat 16 holding substrates 100, each having an insulating film 101 formed thereon, into the process chamber 10, and uses the lid 21 to airtightly close and seal the opening at the lower end of the process chamber 10.

Next, the controller 80 controls the gas supply 30, the exhaust device 40, the heater 50, and the like to perform the step S2 of forming a molybdenum film 102. Specifically, first, the controller 80 controls the exhaust device 40 to reduce the pressure in the process chamber 10 to a predetermined pressure, and controls the heater 50 to stabilize the substrate temperature at a predetermined temperature. Next, the controller 80 controls the gas supply 30 to alternately supply a molybdenum-containing gas and a reducing gas into the process chamber 10. Accordingly, the first molybdenum film 102 is formed on the insulating film 101. In addition, a purge gas may be supplied between the supply of the molybdenum-containing gas and the supply of the reducing gas.

Next, the controller 80 controls the gas supply 30, the exhaust device 40, the heater 50, and the like to perform the step S3 of performing heat treatment. Specifically, first, the controller 80 controls the exhaust device 40 to reduce the pressure in the process chamber 10 to a predetermined pressure, and controls the heater 50 to stabilize the substrate temperature at a predetermined temperature. Next, the controller 80 controls the gas supply 30 to supply an inert gas, a reducing gas, or a mixed gas of two or more thereof into the process chamber 10. Accordingly, the substrates 100 each having the molybdenum film 102 formed on the insulating film 101 are heat-treated. Further, in the step S3 of performing heat treatment, it is preferable to heat the substrates 100 accommodated in the process chamber 10 while decreasing the temperature in the process chamber 10. Accordingly, the time required to decrease the temperature in the process chamber 10 to a transfer temperature after the step S3 of performing heat treatment can be shortened. At this time, a gas supplied into the process chamber 10 is preferably hydrogen gas. Hydrogen gas has high heat exchange efficiency, and thus, the time required to decrease the temperature in the process chamber 10 to the transfer temperature can be shortened.

Next, after the temperature in the process chamber 10 is decreased to the transfer temperature, the controller 80 controls the lifting mechanism 25 to transfer the boat 16 from the process chamber 10.

As described above, the deposition apparatus 1 can form the molybdenum film 102 on the insulating film 101 by the deposition method according to the embodiment.

[Experiment Results]

(Heat Treatment in Argon Atmosphere)

The experiment results, obtained by measuring changes in the resistivities of molybdenum films when the molybdenum films formed on insulating films were heat-treated in an argon atmosphere, will be described.

First, a substrate having an AlO film, i.e., an insulating film, formed thereon was prepared. Then, an ALD cycle, which includes supplying $MoO_2Cl_2$ gas, i.e., a molybdenum-containing gas and supplying $H_2$ gas, i.e., a reducing gas to the substrate, was repeated to form a molybdenum film on the AlO film. Next, the substrate having the molybdenum film formed on the AlO film was heat-treated in an argon atmosphere without being exposed to atmospheric air. The temperature at which the molybdenum film was formed and the temperature at which the molybdenum film was heat-treated were both set to 500° C. to 600° C.

For comparison, a substrate having an AlO film formed thereon was prepared. Then, the ALD cycle, including supplying $MoO_2Cl_2$ gas and supplying $H_2$ gas to the substrate, was repeated to form a molybdenum film on the AlO film. The temperature at which the molybdenum film was formed was set to 500° C. to 600° C., and the molybdenum film was not heat-treated.

Further, for comparison, a substrate having an AlO film formed thereon was prepared. Then, the ALD cycle, including supplying $MoO_2Cl_2$ gas and supplying $H_2$ gas to the substrate, was repeated to form a molybdenum film on the AlO film. Next, the substrate having the molybdenum film formed on the AlO film was heat-treated in an argon atmosphere after being exposed to atmospheric air. The temperature at which the molybdenum film was formed and the temperature at which the molybdenum film was heat-treated were both set to 500° C. to 600° C.

Figure 4:
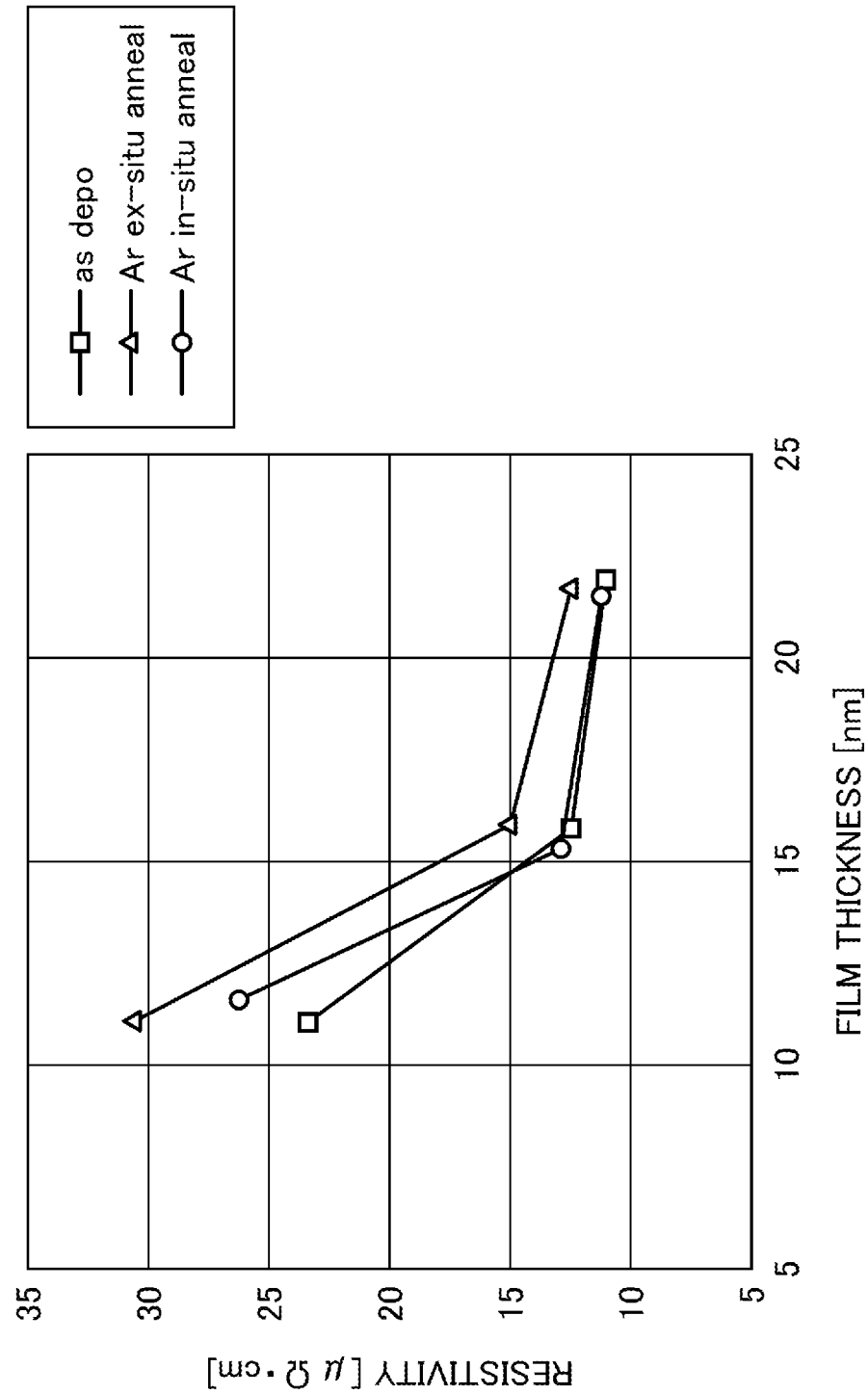
FIG. 4 is a graph illustrating measurement results of the resistivities of molybdenum films.

Next, the thicknesses and resistivities of the formed molybdenum films were measured to obtain the relationship between the thicknesses and resistivities of the molybdenum films. FIG. 4 is a graph illustrating measurement results of the resistivities of the molybdenum films. In FIG. 4, the horizontal axis indicates the thickness [nm] of each of the molybdenum films, and the vertical axis indicates the resistivity [$\mu\Omega \cdot cm$] of each of the molybdenum films. In FIG. 4, a circle mark (Ar in-situ anneal) indicates results obtained when the substrate having the molybdenum film formed on the AlO film was heat-treated in an argon atmosphere without being exposed to atmospheric air. A triangle mark (Ar ex-situ anneal) indicates results obtained when the substrate having the molybdenum film formed on the AlO film was heat-treated in an argon atmosphere after being exposed to atmospheric air. A square mark (as depo) indicates results obtained when the molybdenum film was not heat-treated.

As illustrated in FIG. 4, it can be seen that in a case where the thicknesses of the molybdenum films are greater than or equal to 15 nm, there are no significant differences in the resistivities between when the molybdenum film is not heat-treated and when the substrate having the molybdenum film formed on the AlO film is heat-treated in an argon atmosphere without being exposed to atmospheric air. The results indicate that when the thickness of the molybdenum film is greater than or equal to 15 nm, the resistivity of the molybdenum film does not deteriorate even when the substrate having the molybdenum film formed on the AlO film is heat-treated in an argon atmosphere without being exposed to atmospheric air.

Conversely, as illustrated in FIG. 4, it can be seen that the resistivity increases when the substrate having the molybdenum film formed on the AlO film is heat-treated in an argon atmosphere after being exposed to atmospheric air, as compared to when the molybdenum film is not heat-treated. The results indicate that the resistivity of the molybdenum film deteriorates if the substrate having the molybdenum film formed on the AlO film is heat-treated in an argon atmosphere after being exposed to atmospheric air.

(Heat Treatment in Hydrogen Atmosphere)

The experiment results, obtained by measuring changes in the resistivities of molybdenum films when the molybdenum films formed on insulating films were heat-treated in a hydrogen atmosphere, will be described.

First, a substrate having an AlO film formed thereon was prepared. Then, an ALD cycle, including supplying $MoO_2Cl_2$ gas and supplying $H_2$ gas to the substrate, was repeated to form a molybdenum film on the AlO film. Next, the substrate having the molybdenum film formed on the AlO film was heat-treated in a hydrogen atmosphere without being exposed to atmospheric air. The temperature at which the molybdenum film was formed and the temperature at which the molybdenum film was heat-treated were both set to 500° C. to 600° C.

For comparison, a substrate having an AlO film formed thereon was prepared. Then, the ALD cycle, including supplying $MoO_2Cl_2$ gas and supplying $H_2$ gas to the substrate, was repeated to form a molybdenum film on the AlO film. The temperature at which the molybdenum film was formed was set to 500° C. to 600° C., and the molybdenum film was not heat-treated.

Further, for comparison, a substrate having an AlC film formed thereon was prepared. Then, the ALD cycle, including supplying $MoO_2Cl_2$ gas and supplying $H_2$ gas to the substrate, was repeated to form a molybdenum film on the AlO film. Next, the substrate having the molybdenum film formed on the AlO film was heat-treated in a hydrogen atmosphere after being exposed to atmospheric air. The temperature at which the molybdenum film was formed and the temperature at which the molybdenum film was heat-treated were both set to 500° C. to 600° C.

Next, the thicknesses and resistivities of the formed molybdenum films were measured to obtain the relationship between the thicknesses and resistivities of the molybdenum films. FIG. 5 is a graph illustrating measurement results of the resistivities of the molybdenum films. In FIG. 5, the horizontal axis indicates the thickness [nm] of each of the molybdenum films, and the vertical axis indicates the resistivity [μΩ·cm] of each of the molybdenum films. In FIG. 5, a circle mark ($H_2$ in-situ anneal) indicates results obtained when the substrate having the molybdenum film formed on the AlO film was heat-treated in a hydrogen atmosphere without being exposed to atmospheric air. A triangle mark ($H_2$ ex-situ anneal) indicates results obtained when the substrate having the molybdenum film formed on the AlO film was heat-treated after being exposed to atmospheric air. A square mark (as depo) indicates results obtained when the molybdenum film was not heat-treated.

As illustrated in FIG. 5, it can be seen that in a case where the thicknesses of the molybdenum films are 10 nm, the resistivity decreases when the substrate having the molybdenum film formed on the AlO film is heat-treated in a hydrogen atmosphere without being exposed to atmospheric air, as compared to when the molybdenum film is not heat-treated. Further, it can be seen that in a case where the thicknesses of the molybdenum films are greater than or equal to 15 nm, there are no significant differences in the resistivities between when the molybdenum film is not heat-treated and when the substrate having the molybdenum film formed on the AlO film is heat-treated in a hydrogen atmosphere without being exposed to atmospheric air. The results indicate that the resistivity of the molybdenum film does not deteriorate even when the substrate having the molybdenum film formed on the AlO film is heat-treated in a hydrogen atmosphere without being exposed to atmospheric air.

Conversely, as illustrated in FIG. 5, it can be seen that the resistivity increases when the substrate having the molybdenum film formed on the AlO film is heat-treated in a hydrogen atmosphere after being exposed to atmospheric air, as compared to when the molybdenum film is not heat-treated. The results indicate that the resistivity of the molybdenum film deteriorates if the substrate having the molybdenum film formed on the AlO film is heat-treated in a hydrogen atmosphere after being exposed to atmospheric air.

The embodiment disclosed herein should be considered to be exemplary in all respects and not restrictive. The above-described embodiment may be omitted, substituted, or modified in various forms without departing from the appended claims.

In the above-described embodiment, the deposition apparatus is a batch-type apparatus that processes a plurality of substrates at a time; however, the present disclosure is not limited thereto. For example, the deposition apparatus may be a single-wafer deposition apparatus that processes substrates one by one. For example, the deposition apparatus may be a semi-batch apparatus in which a plurality of substrates disposed on a rotating table in a processing chamber are revolved in accordance with the rotation of the rotating table. In the semi-batch apparatus, the substrates may be processed by passing through a region in which a first gas is supplied and a region in which a second gas is supplied in turn. Further, for example, the deposition apparatus may be a multiple-wafer deposition apparatus that includes multiple tables in a single process chamber.

What is claimed is:

1. A deposition method comprising: preparing a substrate having an insulating film formed thereon; forming a molybdenum film on a surface of the insulating film by supplying a molybdenum-containing gas and a reducing gas to the substrate while the surface of the insulating film is exposed to atmosphere; and heat-treating the substrate having the molybdenum film formed on the insulating film, without exposing the substrate to atmospheric air, wherein the molybdenum film is directly formed on the insulating film.

2. The deposition method according to claim 1, wherein the heat-treating includes heat-treating the substrate in an inert gas atmosphere or in a reducing gas atmosphere.

3. The deposition method according to claim 1, wherein the heat-treating includes heat-treating the substrate at a constant temperature.

4. The deposition method according to claim 1, wherein the heat-treating includes heat-treating the substrate while decreasing a temperature of the substrate.

5. The deposition method according to claim 1, wherein the heat-treating is performed at a temperature higher than a temperature at which the molybdenum film is formed.

6. The deposition method according to claim 1, wherein the heat-treating is performed at a same temperature as a temperature at which the molybdenum film is formed.

7. The deposition method according to claim 1, wherein the heat-treating is performed at a temperature lower than a temperature at which the molybdenum film is formed.

8. The deposition method according to claim 1, wherein the insulating film is formed of a blocking oxide film.

9. The deposition method according to claim 1, wherein the molybdenum containing gas is molybdenum dichloride dioxide ($MoO_2Cl_2$) gas.

10. The deposition method according to claim 1, wherein the reducing gas is hydrogen gas.

* * * * *